United States Patent
Difoggio et al.

(10) Patent No.: US 10,631,409 B2
(45) Date of Patent: Apr. 21, 2020

(54) ELECTRICAL ASSEMBLIES FOR DOWNHOLE USE

(71) Applicant: BAKER HUGHES INCORPORATED, Houston, TX (US)

(72) Inventors: Rocco Difoggio, Houston, TX (US); Otto N. Fanini, Houston, TX (US); Paul G. Cairns, Houston, TX (US); Brian D. Breaux, Houston, TX (US); Benjamin Todd, Cypress, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 228 days.

(21) Appl. No.: 15/231,438

(22) Filed: Aug. 8, 2016

(65) Prior Publication Data

US 2018/0042111 A1 Feb. 8, 2018

(51) Int. Cl.
*B23K 1/005* (2006.01)
*H05K 1/18* (2006.01)
(Continued)

(52) U.S. Cl.
CPC ........... *H05K 1/181* (2013.01); *B23K 1/0056* (2013.01); *E21B 47/011* (2013.01); *E21B 49/00* (2013.01);
(Continued)

(58) Field of Classification Search
CPC .. B23K 26/18; B23K 1/0056; B23K 2201/42; B23K 2101/42
See application file for complete search history.

(56) References Cited

U.S. PATENT DOCUMENTS 3,366,914 A    1/1968    Mcmanus et al.
3,719,917 A *  3/1973    Fischer .................. H05K 3/325
                                                              439/329
(Continued)

FOREIGN PATENT DOCUMENTS

JP        2013018010 A  *  1/2013
KR     1020160066739 A      6/2016
(Continued)

OTHER PUBLICATIONS

Hu et al., "Effect of graphene doping on microstructural and mechanical properties of Sn—8Zn—3Bi solder joints together with electromigration analysis",May 2013, Elsevier, Journal of Alloys and Compounds, vol. 580, pp. 162-171.*

(Continued)

*Primary Examiner* — Geoffrey S Evans
(74) *Attorney, Agent, or Firm* — Mossman, Kumar & Tyler PC

(57) ABSTRACT

Methods, systems, devices, and products for manufacturing an electrical assembly, such as a completed downhole circuit board, for use in well logging. Methods include attaching an electrical component to a printed circuit board by mechanically fastening the electrical component to the printed circuit board. Methods may include using a laser to attach a plurality of legs to contact surfaces. Methods may include applying light from the laser to a material of the printed circuit board to produce heat, including mitigating reflection of the light from the material. Methods include forming a connection between a first electrical component of the electrical assembly and a second electrical component of the electrical assembly by causing heating of an additive manufacturing material by applying light from a laser. The connection may be at least one of: i) an electrical connection; ii) a structural connection; iii) an electrical insulation.

5 Claims, 12 Drawing Sheets

(51) Int. Cl.
*E21B 47/01* (2012.01)
*H05K 3/32* (2006.01)
*E21B 49/00* (2006.01)
*H05K 1/11* (2006.01)
*H05K 3/34* (2006.01)
*B23K 101/42* (2006.01)
*B33Y 10/00* (2015.01)
*B23K 26/18* (2006.01)
*G01V 3/18* (2006.01)

(52) U.S. Cl.
CPC ............. *H05K 1/113* (2013.01); *H05K 3/325* (2013.01); *H05K 3/341* (2013.01); *B23K 26/18* (2013.01); *B33Y 10/00* (2014.12); *G01V 3/18* (2013.01); *H05K 2201/1059* (2013.01); *H05K 2201/10151* (2013.01); *H05K 2201/10257* (2013.01); *H05K 2201/10295* (2013.01); *H05K 2201/10401* (2013.01); *H05K 2201/10628* (2013.01); *H05K 2203/107* (2013.01)

(56) References Cited

U.S. PATENT DOCUMENTS

| | | | |
|---|---|---|---|
| 4,109,295 A | 8/1978 | Rostek et al. | |
| 4,327,277 A * | 4/1982 | Daly | B23K 1/0056 219/121.64 |
| 4,513,064 A | 4/1985 | Marcus | |
| 4,732,446 A | 3/1988 | Gipson et al. | |
| 4,792,658 A * | 12/1988 | Langhans | B23K 1/0056 219/121.63 |
| 5,049,718 A * | 9/1991 | Spletter | B23K 26/18 219/121.64 |
| 5,110,298 A | 5/1992 | Dorinski et al. | |
| 5,135,403 A | 8/1992 | Rinaldi | |
| 5,145,408 A | 9/1992 | Houtteman et al. | |
| 5,274,210 A * | 12/1993 | Freedman | B23K 1/0056 219/121.63 |
| 5,484,979 A * | 1/1996 | Gao | B23K 1/0056 219/121.63 |
| 5,529,502 A | 6/1996 | Peltier et al. | |
| 5,774,341 A | 6/1998 | Urbish et al. | |
| 5,883,788 A | 3/1999 | Ondricek et al. | |
| 6,160,710 A | 12/2000 | Bengt et al. | |
| 6,168,070 B1 * | 1/2001 | Sinkunas | H05K 3/341 219/121.63 |
| 6,580,613 B2 | 6/2003 | Frankowsky | |
| 6,707,684 B1 | 3/2004 | Andric et al. | |
| 6,910,897 B2 | 6/2005 | Driscoll et al. | |
| 7,017,662 B2 | 3/2006 | Schultz et al. | |
| 7,423,258 B2 | 9/2008 | DiFoggio et al. | |
| 7,675,166 B2 | 3/2010 | Gordon et al. | |
| 2002/0056891 A1 * | 5/2002 | Wu | B23K 26/10 257/620 |
| 2003/0019846 A1 * | 1/2003 | Sinkunas | B23K 1/0056 219/85.13 |
| 2004/0084679 A1 | 5/2004 | Nakayama | |
| 2006/0021681 A1 * | 2/2006 | Yamada | B23K 1/0056 148/512 |
| 2006/0166526 A1 | 7/2006 | Lee et al. | |
| 2008/0112143 A1 * | 5/2008 | Hanley | H05K 3/301 361/752 |
| 2010/0155947 A1 * | 6/2010 | Pang | B23K 35/262 257/741 |
| 2012/0040541 A1 * | 2/2012 | Liskow | H01R 12/778 439/67 |
| 2012/0315772 A1 | 12/2012 | Joschika | |
| 2013/0327444 A1 * | 12/2013 | Sawamura | B23K 35/025 148/24 |
| 2015/0330208 A1 * | 11/2015 | Haubold | E21B 47/011 166/380 |
| 2016/0057853 A1 * | 2/2016 | Zacharko | H05K 1/0265 166/66 |
| 2016/0181217 A1 * | 6/2016 | Prack | H01L 24/11 438/613 |

FOREIGN PATENT DOCUMENTS

| | | |
|---|---|---|
| WO | 0074450 A1 | 12/2000 |
| WO | 2005119119 A1 | 12/2005 |

OTHER PUBLICATIONS

Machine translation of Japan Patent document No. 2013-018,010, Mar. 2019 (Year: 2019).*
Scotti, Electromigration in Solder Interconnects, Jun. 2008, Technical Report , Helsinki University of Technology-TKK.*
Beckett, P.M., et al., "Numerical Modelling of Scanned Beam Laser Soldering of Fine Pitch Packages," Soldering & Surface Mount Technology 14/1, pp. 24-29 (Apr. 2002).
Gilbert, James M., et al., "Laser Soldering Control Using Optical Imaging," Soldering & Surface Mount Technology, 18/4, pp. 3-11 (Jan. 2006).
Kasichainula, Jag, "EAGER: Processing and Characterization of Novel Indium-graphene and Copper-graphene Composites for Heat Spreader Applications," CMMI: 1049751, CMMI, Materials Science and Engineering, North Carolina State University (Jul. 2010).
Niziev, V.G. et al., "Numerical Modeling of Sintering of Two-Component Metal Powders With Laser Beams," Proc. of SPIE vol. 7994 79941W (Feb. 2011).
Sruti, A. Naga et al., "Electrical Conductivity of Graphene Composites With In and In—Ga Alloy," Jnl of Electronic Materials, vol. 39, No. 8, pp. 1268-1276 (Apr. 2010).
Jagannadiiam, K., Thermal Conductivity of Indium-Graphene and Indium-Gallium-Graphene Composites, Jnl of Electronic Materials, vol. 40, No. 1, pp. 25-34 (Oct. 2010).
Ruttimann, Christoph et al., "Reliable Laser Welding of Highly Reflective Materials," Proc. of SPIE, vol. 8065, 11 pages (Apr. 2011).
Hieber, H., "Microsoldering With Short-Pulsed IR Laser" (Sep. 2011).
Liu, X.D. et al., "Effect of Graphene Nanosheets Reinforcement on the Performance of Sn—Ag—Cu Lead-Free Solder," Materials Science & Engr A. 562 pp. 25-32 (Nov. 2012).
Pastorek, Nathan, et al., "Downhole Sensors in Drilling Operations", Proceedings, 44the Workshop on Geothermal Reservoir Engineering Stanford Univ., Feb. 11, 2019, 1-9.
Yamaguchi, Atsushi, et al., "Properties of Solder Joints Using Sn—Ag—Bi—In Solder", Materials Transaction, 45:4, Feb. 2004, 1282-1289.

* cited by examiner

ELECTRICAL ASSEMBLIES FOR DOWNHOLE USE

FIELD OF THE DISCLOSURE

In one aspect, this disclosure relates generally to borehole tools, and in particular to tools used for drilling a borehole in an earth formation.

BACKGROUND OF THE DISCLOSURE

Drilling wells for various purposes is well-known. Such wells may be drilled for geothermal purposes, to produce hydrocarbons (e.g., oil and gas), to produce water, and so on. Well depth may range from a few thousand feet to 25,000 feet or more. Downhole tools often incorporate various sensors, instruments and control devices in order to carry out any number of downhole operations. Thus, the tools may include sensors and/or electronics for formation evaluation, fluid analysis, monitoring and controlling the tool itself, and so on. Tools typically include one or more printed circuit boards having electrical components attached.

SUMMARY OF THE DISCLOSURE

In aspects, the present disclosure is related to methods and apparatus for performing well logging in a borehole intersecting an earth formation. Apparatus may include a carrier conveyable in the borehole; a tool disposed on the carrier comprising an electrical assembly made up of connected circuit elements. The electrical assembly may include a printed circuit board comprising electrically conductive contact surfaces for connection of circuit elements via the board; and at least one circuit element. The at least one circuit element may include a plurality of legs permanently electrically coupled to the printed circuit board via application of a force by at least one mechanical fastener maintaining a surface of each leg in sufficient physical contact with a corresponding one of the contact surfaces for uninterrupted electrical connection.

The electrically conductive contact surfaces may comprise pads. The at least one circuit element may comprise at least one integrated circuit; and the at least one mechanical fastener may comprise a fastener for each leg of the plurality of legs. The force may act directly on the corresponding one of the contact surfaces. The force may include a clamping force provided by the fastener for each leg acting directly on the surface of each leg and the corresponding one of the contact surfaces in opposing directions. The fastener for each leg may include at least one of: i) a rivet; ii) a screw; iii) a bolt; iv) a staple; and v) a swage.

The fastener for each leg may reside in a conductive via of the PCB proximate the pad. The fastener for each leg may penetrate through each leg and the corresponding one of the contact surfaces. The force may act directly on each leg. The electrically conductive contact surfaces may include vias opening to a plurality of surfaces of the PCB. The fastener may act to mechanically deform a leg of the plurality of legs. The fastener may comprise a swage applying at least a portion of the force, and the swage may apply at least a first portion of the force against an inner surface of a conductive via of the PCB. The swage may apply a second portion of the force against an outer surface of the leg opposite the first portion. The swage may apply a third portion of the force against a contact surface proximate the inner surface of the conductive via. The third portion may be substantially perpendicular to the first portion and the second portion. The swage may comprise a shape memory material.

The fastener may be a load-bearing fastener. The uninterrupted electrical connection may be a solderless connection. A footprint of the PCB and the fastener in combination may be substantially the same as the footprint of the PCB alone. Each leg may be constrained in three dimensions by the at least one fastener. The fastener may be significantly electrically conductive. At least one of: i) the fastener, or ii) the plurality of legs may be welded to at least one other component of the logging tool.

In aspects, the present disclosure is related to methods and apparatus for manufacturing an electrical assembly, such as a completed downhole circuit board, for use in well logging. Methods may include forming an electrical assembly including attaching an electrical component to a printed circuit board by applying light from a laser to a material of the electrical assembly to produce heat, wherein the attaching includes mitigating reflection of the light from the material. The material may comprise at least one of: i) the component; ii) the printed circuit board; iii) solder; iv) an additive manufacturing material; and v) an intermediate component thermally connected to at least one of the component, the substrate, the additive manufacturing material, and the solder.

Mitigating reflection may include applying a treatment to the material, wherein the treatment is configured to increase absorption of the light at the material. The treatment may be significantly thermally conductive. Attaching an electrical component may include applying the light to solder, wherein the solder comprises a metal and a light absorbent compound. The light absorbent compound may comprise graphene. Mitigating reflection may comprise using a laser wherein the light has a wavelength of less than 450 nanometers. The light may be produced at a first wavelength. Methods may include applying light from a second laser to a second material of the circuit board, wherein the light from the second laser has a second wavelength different than the first wavelength. Methods may include controlling the first laser separately from the second laser.

In aspects, the present disclosure is related to methods and apparatus for manufacturing an electrical assembly, such as a completed downhole circuit board, for use in well logging. Methods may include attaching an electrical component to a printed circuit board by mechanically fastening the electrical component to the printed circuit board. The at least one circuit element may include a plurality of legs permanently electrically coupled to the printed circuit board via application of a force by at least one mechanical fastener maintaining a surface of each leg in sufficient physical contact with a corresponding one of the contact surfaces for uninterrupted electrical connection. Methods may include using a laser to attach the plurality of legs to respective ones of the contact surfaces. Methods may include applying light from the laser to a material of the printed circuit board to produce heat including mitigating reflection of the light from the material.

Other methods include forming a connection between a first electrical component of the electrical assembly and a second electrical component of the electrical assembly. Forming the connection may be carried out by causing heating of an additive manufacturing material by applying light from a laser. Forming the connection may comprise mitigating reflection of the light from the material. The connection may be at least one of: i) an electrical connection; ii) a structural connection; iii) an electrical insulation.

Methods may include placing and bonding at least one of the first electrical component and the second electrical component to a third component.

Examples of some features of the disclosure may be summarized rather broadly herein in order that the detailed description thereof that follows may be better understood and in order that the contributions they represent to the art may be appreciated.

BRIEF DESCRIPTION OF THE DRAWINGS

For a detailed understanding of the present disclosure, reference should be made to the following detailed description of the embodiments, taken in conjunction with the accompanying drawings, in which like elements have been given like numerals, wherein.

DETAILED DESCRIPTION

Figure 1A:
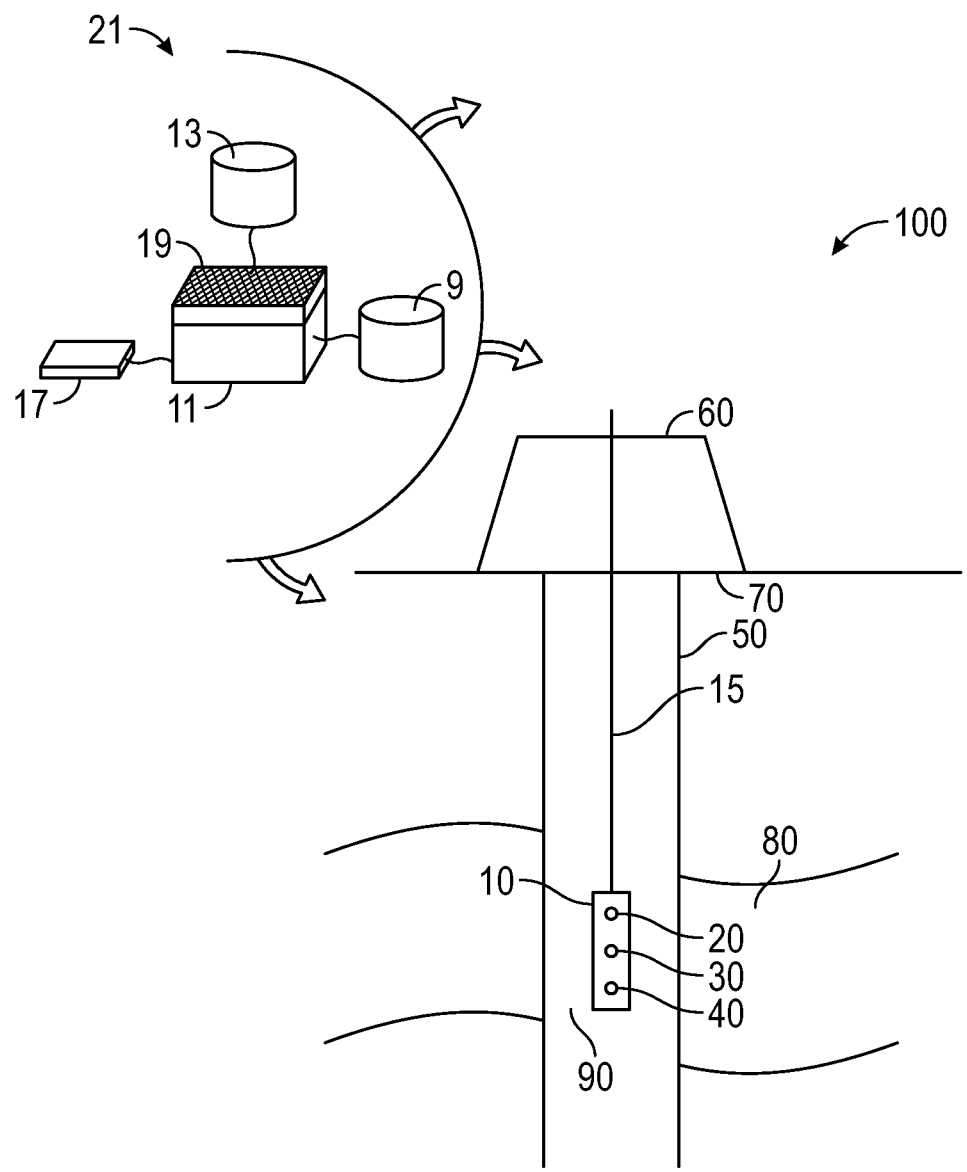
FIG. 1A schematically illustrates a system having a downhole tool configured to acquire information in a borehole intersecting a volume of interest of an earth formation for estimating parameters of interest of the formation.

Aspects of the present disclosure relate to improvements in printed circuit boards for use downhole. Aspects include apparatus for drilling boreholes and downhole logging including one or more printed circuit boards adapted for the rigors of this application.

Traditional printed circuit boards have been around for many decades as one common electrical assembly manufacturing solution. Conventionally, solder is used as the primary method of attaching electrical components (e.g., integrated circuits (ICs)) to the printed circuit board (PCB). A printed circuit board (PCB) is a plate or board comprising a substrate supporting different elements that make up an electrical circuit that contains the electrical interconnections between them. Together, upon assembly, the components (including one or more PCBs) making up the electrical circuit is referred to herein collectively as an electrical assembly (EA). As one example, downhole tools and sensors may use an integrated circuit (IC) that integrates all components of a computer or other electronic system into a single chip, referred to herein as a system on a chip (SoC or SOC) as a high level of functional spatial integration into a complex integrated circuit. The SoC may contain digital, analog, mixed-signal, and/or radio-frequency functions—on a single chip substrate. It is also possible to incorporate multiple SoC modules mounted with other substrates containing electrical components.

One or more Multiple Chip Modules (MCM) may integrate electrical assemblies completed entirely or partially in a previous step in the manufacturing process. ICs integrated into the Electrical Assembly (EA) could have been manufactured with various spatial integration level technologies such as Large Scale Integration (LIS), Very Large Scale Integration (VLSI) or Ultra Large Scale Integration (ULSI).

Measurement-while-drilling and logging-while-drilling (MWD/LWD) tools experience demanding conditions, including elevated levels of vibration, shock, and heat.

Vibration and shock experienced by the components of a MWD/LWD tool may reach levels of greater than 50 times the force of gravity (gravitational units, g). Severe downhole vibrations can damage drilling equipment including the drill bit, drill collars, stabilizers, MWD/LWD, and Rotary Steerable System (RSS).

MWD/LWD tools continue to be exposed to ever hotter environments. With exposure to elevated temperatures over an extended period of time, there is a tendency in traditionally manufactured circuit boards for the solder to migrate away from the legs (or pins) of the component, causing a very weak solder joint. This weakened joint is then increasingly susceptible to fracture due to the tool vibration. These fractures can open completely and effectively break the electrical connection and thereby induce an electrical failure of the circuit.

Thus, as one solution, it would be advantageous to use high-melting-point solder to avoid these failures. Unlike low temperature soldering, for which the process can be automated, such as, for example, by wave soldering, soldering with high-melting-point solder is a difficult process that is conventionally done by hand. This can be costly and time-consuming, as well as unreliable. Laser soldering and laser welding are practiced in other fields of manufacturing, and can be automated. In principle, use of a laser to attach electrical components to the PCB may produce more consistent solder joints. Unfortunately, it is also known that laser soldering has a number of difficulties. The metals used in this solder are highly reflective of laser light, so very little light energy from the laser gets absorbed and converted to heat to melt the solder.

Aspects of the present disclosure, therefore, include mitigating reflection of the laser light from the material to which the laser light is being applied in order to attach an electrical component to the PCB. The material may be at least one of: i) the component; ii) the substrate; iii) solder; and iv) an intermediate component thermally connected to at least one of the component, the substrate, and the solder.

In general embodiments, this mitigation may be carried out by using a wavelength of laser light that is much better absorbed by the metal than the traditional laser soldering wavelengths of 820 nanometers, 900 nanometers, 1.06 microns, or 10.6 microns, such as, for example, by using a wavelength of light less than blue (i.e., less than 450 nanometers) for gold or less than ultraviolet (i.e., less than 330 nanometers) for silver. The improvement in light absorption by the metal can be dramatic. For example, silver reflects 95% of light at 450 nm but it only reflects 5% of light at 320 nm corresponding to a 19-fold improvement in absorption and the associated heating by going to this shorter wavelength (https://www.quora.com/Do-mirrors-reflect-ultraviolet-and-infrared-light-too). Other metals and alloys and corresponding wavelengths appropriate to improved light absorption for those metals and alloys could also be used. Further embodiments may include applying a treatment to the material, wherein the treatment is configured to increase absorption of the light at the material. The treatment may be significantly thermally conductive, in order to increase the rate of heat distribution and equilibration through the material. The treatment could be in the form of solder, flux, or a pre-coating material. The treatment may be added to solder prior to after placement of the solder for heating by the laser. The techniques of laser attachment, including soldering, sintering, and welding, may improve reliability, increase the lifespan of the PCB and the tool, and reduce the cost of manufacturing.

In other aspects of the present disclosure, solder migration challenges may be overcome by attaching an electrical component (e.g., an IC) to a printed circuit board by mechanically fastening the electrical component to the printed circuit board to electrically connect the component to the PCB. Techniques of the present disclosure include electrically connecting the component to the PCB using a mechanical fastener or by welding.

The printed circuit board may include electrically conductive contact surfaces for connection of circuit elements via the board, and the electrical component may include at least one circuit element including a plurality of legs. Methods may include permanently electrically coupling the electrical component to the printed circuit board by welding the plurality of legs to respective ones of the contact surfaces using a laser. Alternatively or additionally, the legs of the component may be riveted, screwed, or otherwise mechanically fastened to the PCB.

Components of the electrical assembly may be connected using additive manufacturing by applying laser light to one or more additive manufacturing materials. Additive manufacturing (AM) refers to a process by components are building in layers by depositing material, such as, for example, 3D printing. Laser cladding for quite some time has been a method of depositing material by which a powdered, or wire feedstock material is melted or dispensed and consolidated by use of a laser in order to coat part of a substrate or fabricate a near-net shape part later known as additive manufacturing (AM) technology. Later on AM included the use of fluid micro-pumped or micro-bubble spray flow to build and assemble components. Components of the electrical assembly may be connected, fastened, mounted on a substrate (ceramic, glass, etc.) made using additive manufacturing in a sequence of manufacturing steps by applying laser light to one or more additive manufacturing materials dispensed or fed into a AM manufacturing chamber.

AM is clearly distinguished from conventional methods of material removal commonly known as subtractive manufacturing (SM). Instead of milling a work piece from solid block, for example, components may be built layer by layer using fine powder additive manufacturing materials which respond to the heat from the laser or the laser light itself. A range of different metals, plastics and composite materials may be used.

Some aspects of the present disclosure include hybrid manufacturing (HM), which offers both the advantages of Additive and Subtractive Manufacturing combined with the laser or electron beam additive deposition in the same manufacturing chamber, and which may be used to generate components such as isolators, conductors or structural fasteners. The manufacturing chamber could have multiple additive manufacturing material injectors containing multiple additive manufacturing materials for higher manufacturing productivity.

Another source of heat used alternatively to the laser can be an electron beam to accomplish the manufacturing of an electrical assembly (EA) with additive manufacturing. The Electron beam could be used more effectively in more precise attachment connections. A range of different metals, plastics, alloys, polymers, ceramics, and composite materials may be used and fed into the laser activated AM chamber in the form of micropowder, nanopowder, micro filament feed form, and micro-pumped liquid methods among others.

Aspects of the present disclosure allow for the production of highly complex structures which can still be extremely light and stable, while decreasing costs of fabrication and maintaining a high degree of product customization, integration and miniaturization. A thin layer of material may be applied to a building platform. A powerful laser beam may then fuse the powder according to component design data with high accuracy. The platform is then lowered and another layer of powder is applied. Once again the material is fused so as to bond with the layer below at the predefined points. Additive manufacturing may also involve various technologies like laser sintering (LS), laser engineered net shaping (LENS), selective laser sintering ('SLS), direct metal laser sintering (DMLS), ultrasonic additive manufacturing (UAM), laser assisted ultrasonic additive manufacturing (LUAM), etc.

Aspects of the present disclosure include techniques to provide linkages with an electrical function, mechanical strength function, or both combined to produce compact, complex, multi-level electrical assemblies. These techniques may result in improved volume and space utilization efficiency, including miniaturization. The AM-made connections, which can include suspended electrical connections between two electrical terminal, an electrical connecting trace deposited on a substrate, a linking terminal involving a trace and suspended electrical connecting link, the mechanical connection of two adjacent structural fastening points to add structural rigidity, and so on. AM may be used to deposit electrical or structural terminals in contact points or mechanical support points, or to form contact points and connect them in spatially constrained envelopes in ways not possible with conventional manufacturing. AM can deposit electrically conductive material elements along with electrically isolating elements to form a functional structure with conductors routed through the electrical assembly structure separated by electrical isolating structures.

Structural components can be attached to (or built around) glass electrically isolating materials, such as, for example, borosilicate glass, thereby forming an isolation layer or a cylindrically shaped isolating layer around a conductor formed by AM. Borosilicate glass has a low coefficient of thermal expansion (CTE) with good thermal shock resistance required for AM-driven electrical assembly compatibility. Similarly, it can become part of AM deposited stacks.

Electrical assemblies may be used in various downhole systems, including use in components such as power supplies, sensor pads (e.g., with internally mounted electronics), active sensors (e.g., with either or both of integrated and proximately mounted electronics). Electrical assemblies (EAs) can be constructed with three forms of connection built with the action of laser beams: i) structural fastening and mechanical strength elements; ii) electrical connection of terminals or components installed in a previous step; and iii) a hybrid connection providing both electrical and mechanical connection.

In addition to PCBs, there are other forms of electrical assembly that can benefit from having connections and structural fastening construction with the assistance of laser beams, including Multiple Chip Modules (ceramic and laminated substrates for example) mounted on substrates, passive electrical elements mounted on substrates, three-dimensional (3D) stacked substrate levels with electrical components mounted on each substrate level, terminal to terminal suspended connections or connected traces on a single substrate or across multiple substrate boundaries or regions, sensors, components discretely mounted on a substrate, 3D stacks of multiple Integrated Circuits (IC) built on spacers, piles or ball grid assembly (including, e.g., assemblies with terminal extensions mounted on the IC's with pre-assembled structural fastening links), and so on as will occur to those of skill in the art. A more complex multi-assembly level electrical assembly could be formed with multiple other initial electrical assemblies which, for example, may have structural links and connections formed by the application of laser light.

Aspects disclosed herein allow construction of assemblies with added spatial and geometry envelope flexibility, compact and higher volumetric utilization efficiency, enabling the building of electrical assemblies composed of elements with odd and arbitrary shapes to fit constrained space envelopes, including downhole equipment and parts like drilling bits, wireline equipment, drilling, coiled tubing, directional sondes, formation measuring pads, formation testers, acoustic instrumentation, transmitters and receivers, resistivity instrumentation, nuclear instrumentation, and so on.

Elements may provide various functionality and may implement electrical connections, structural body and integrity to support external stresses (e.g., shock and vibration), and electrical isolation. The suggested wavelengths have higher absorption rates requiring lower optical energy levels to be applied to the assembly, and thus decreased assembly temperature rise and associated collateral damage during the construction. Additive manufacturing (e.g., 3D printing) in accordance with the techniques described herein electrical connecting or structural support terminals, building electrical connections on terminals and structural links, isolator components (oxides of aluminum and nickel, ceramics, plastics, polymers, non-conductive compounds, etc.).

In aspects, the present disclosure includes an apparatus for performing well logging in a borehole intersecting an earth formation. The apparatus may include a carrier conveyable in the borehole and a logging instrument disposed on the carrier. The logging instrument may include a printed circuit board comprising electrically conductive contact surfaces for connection of circuit elements via the board; and at least one circuit element, where the at least one circuit element includes a plurality of legs and is permanently electrically coupled to the printed circuit board via application of a force by at least one mechanical fastener maintaining a surface of each leg in sufficient physical contact with a corresponding one of the contact surfaces for uninterrupted electrical connection. The force may be compressive.

Techniques described herein are particularly suited for use in measurement of values of properties of a formation downhole or of a downhole fluid while drilling, through the use of instruments which may utilized PCBs as described herein. These values may be used to evaluate and model the formation, the borehole, and/or the fluid, and for conducting further operations in the formation or the borehole.

FIG. 1A schematically illustrates a system 100 having a downhole tool 10 configured to acquire information in a borehole 50 intersecting a volume of interest of an earth formation 80 for estimating density, oil saturation, and/or other parameters of interest of the formation 80. The parameters of interest may include information relating to a geological parameter, a geophysical parameter, a petrophysical parameter, and/or a lithological parameter. Thus, the tool 10 may include sensors 20, 30 and 40 for detecting physical phenomena indicative of a parameter of interest. Sensors 20, 30 and 400 may include sensors for estimating formation resistivity, dielectric constant, the presence or absence of hydrocarbons, acoustic density, bed boundary, formation density, nuclear density and certain rock characteristics, permeability, capillary pressure, and relative permeability.

The system 100 may include a conventional derrick 60 and a conveyance device (or carrier) 15, which may be rigid or non-rigid, and may be configured to convey the downhole tool 10 into wellbore 50 in proximity to formation 80. The carrier 15 may be a drill string, coiled tubing, a slickline, an e-line, a wireline, etc. Downhole tool 10 may be coupled or combined with additional tools. Thus, depending on the configuration, the tool 10 may be used during drilling and/or after the borehole (wellbore) 50 has been formed. While a land system is shown, the teachings of the present disclosure may also be utilized in offshore or subsea applications. The carrier 15 may include embedded conductors for power and/or data for providing signal and/or power communication between the surface and downhole equipment. The carrier 15 may include a bottom hole assembly, which may include a drilling motor for rotating a drill bit. Drilling fluid 90 may be present between the formation 80 and the downhole tool 10.

Certain embodiments of the present disclosure may be implemented with a hardware environments that includes an information processor 11, an information storage medium 13, an input device 17, processor memory 19, and may include peripheral information storage medium 9. The hardware environments may be in the well, at the rig, or at a remote location. Moreover, the several components of the hardware environments may be distributed among those locations. The input device 17 may be any data reader or user input device, such as data card reader, keyboard, USB port, etc. The information storage medium 13 stores information provided by the detectors. Information storage medium 13 may include any non-transitory computer-readable medium for standard computer information storage, such as a USB drive, memory stick, hard disk, removable RAM, EPROMs, EAROMs, flash memories and optical disks or other commonly used memory storage system known to one of ordinary skill in the art including Internet based storage. Information storage medium 13 stores a program that when executed causes information processor 11 to execute the disclosed method. Information storage medium 13 may also store the formation information provided by the user, or the formation information may be stored in a peripheral information storage medium 9, which may be any standard computer information storage device, such as a USB drive, memory stick, hard disk, removable RAM, or other commonly used memory storage system known to one of ordinary skill in the art including Internet based storage. Information processor 11 may be any form of computer or mathematical processing hardware, including Internet based hardware. When the program is loaded from information storage medium 13 into processor memory 19 (e.g. computer RAM), the program, when executed, causes information processor 11 to retrieve detector information from either information storage medium 13 or peripheral information storage medium 9 and process the information to estimate a parameter of interest. Information processor 11 may be located on the surface or downhole.

The term "information" as used herein includes any form of information (analog, digital, EM, printed, etc.). As used herein, a processor is any information processing device that transmits, receives, manipulates, converts, calculates, modulates, transposes, carries, stores, or otherwise utilizes information. In several non-limiting aspects of the disclosure, an information processing device includes a computer that executes programmed instructions for performing various methods. These instructions may provide for equipment operation, control, data collection and analysis and other functions in addition to the functions described in this disclosure. The processor may execute instructions stored in computer memory accessible to the processor, or may employ logic implemented as field-programmable gate arrays ('FPGAs'), application-specific integrated circuits ('ASICs'), other combinatorial or sequential logic hardware, and so on.

In other embodiments, such electronics may be located elsewhere (e.g., at the surface, or remotely). To perform the measurement during a single trip, the tool may use a high bandwidth transmission to transmit the information acquired by sensor array 30 to the surface for analysis. For instance, a communication line for transmitting the acquired information may be an optical fiber, a metal conductor, or any other suitable signal conducting medium. It should be appreciated that the use of a "high bandwidth" communication line may allow surface personnel to monitor and control the measurement activity in "real time." Each of the components described above may be implemented as one or more electrical components, such as integrated circuits (ICs), operatively connected via a circuit board in accordance with techniques of the present disclosure.

Figure 1B:
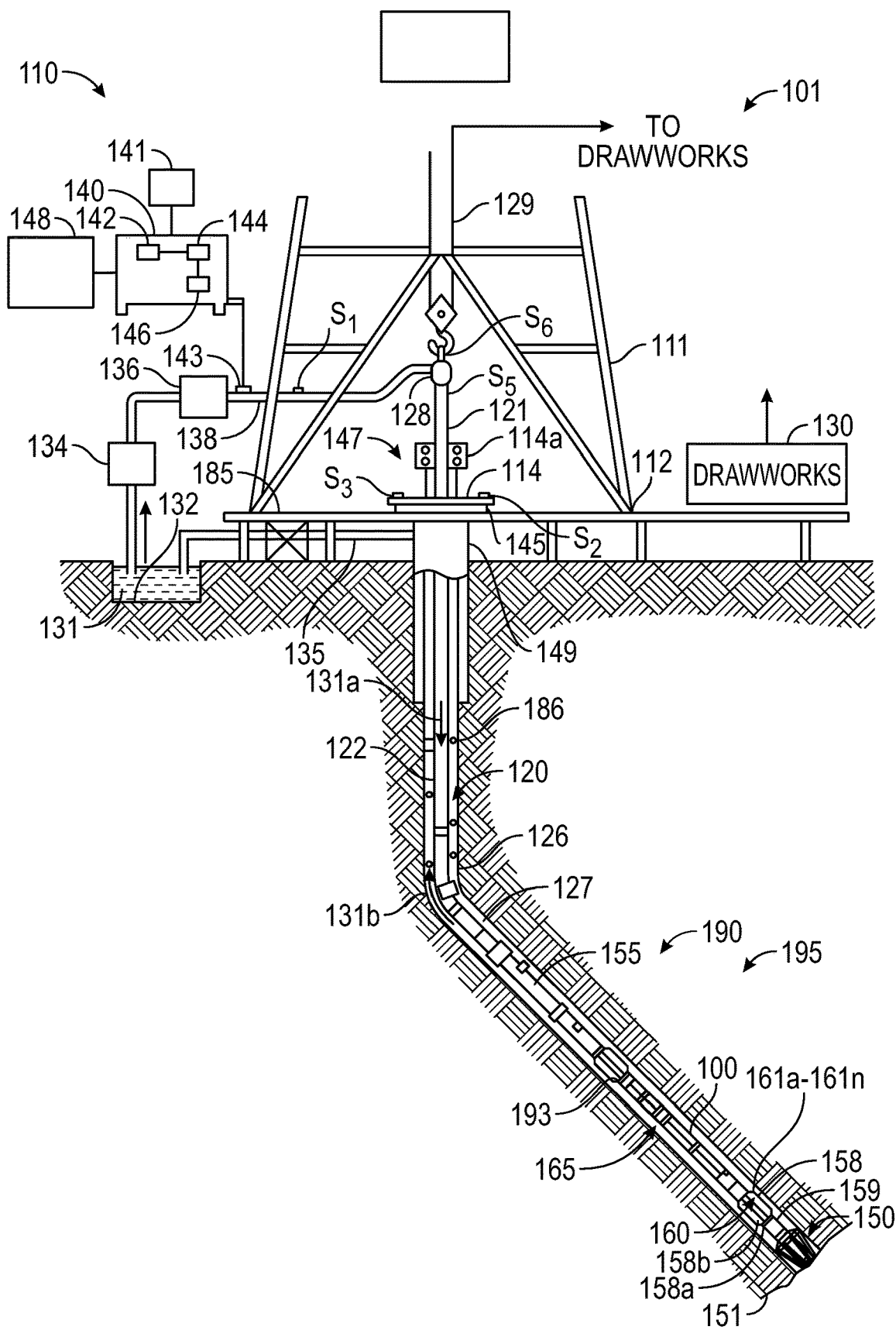
FIG. 1B shows an exemplary embodiment of an MWD system for evaluation of an earth formation using measurements from a well logging tool.

Aspects of the present disclosure are subject to application in various different embodiments. In some general embodiments, carrier 15 is implemented as a tool string of a drilling system, and measurements taken in the borehole may be characterized as "logging-while-drilling" (LWD) or "measurement-while-drilling" (MWD) operations. FIG. 1B shows an exemplary embodiment of an MWD system for evaluation of an earth formation using measurements from a well logging tool. The system 101 includes a carrier 111 that is shown disposed in a wellbore or borehole 126 that penetrates at least one earth formation 195.

FIG. 1B shows a drill string 120 including a bottomhole assembly (BHA) 190 conveyed in the borehole 126 as the carrier. The drilling system 101 includes a conventional derrick 111 erected on a platform or floor 112 which supports a rotary table 114 that is rotated by a prime mover, such as an electric motor (not shown), at a desired rotational speed. A tubing (such as jointed drill pipe 122), having the drilling assembly 190, attached at its bottom end extends from the surface to the bottom 151 of the borehole 126. A drill bit 150, attached to drilling assembly 190, disintegrates the geological formations when it is rotated to drill the borehole 126.

The drill string 120 is coupled to a drawworks 130 via a Kelly joint 121, swivel 128 and line 129 through a pulley. Drawworks 130 is operated to control the weight on bit ("WOB"). The drill string 120 may be rotated by a top drive (not shown) instead of by the prime mover and the rotary table 114. Alternatively, a coiled-tubing may be used as the tubing 122. A tubing injector 114a may be used to convey the coiled-tubing having the drilling assembly attached to its bottom end. The operations of the drawworks 130 and the tubing injector 114a are known in the art and are thus not described in detail herein.

A suitable drilling fluid 131 (also referred to as the "mud") from a source 132 thereof, such as a mud pit, is circulated under pressure through the drill string 120 by a mud pump 134. The drilling fluid 131 passes from the mud pump 134 into the drill string 120 via a discharger 136 and the fluid line 138. The drilling fluid 131a from the drilling tubular discharges at the borehole bottom 151 through openings in the drill bit 150. The returning drilling fluid 131b circulates uphole through the annular space 127 between the drill string 120 and the borehole 126 and returns to the mud pit 132 via a return line 135 and drill cutting screen 185 that removes the drill cuttings 186 from the returning drilling fluid 131b. A sensor S1 in line 138 provides information about the fluid flow rate. A surface torque sensor S2 and a sensor S3 associated with the drill string 120 respectively provide information about the torque and the rotational speed of the drill string 120. Tubing injection speed is determined from the sensor S5, while the sensor S6 provides the hook load of the drill string 120.

In some applications, the drill bit 150 is rotated by only rotating the drill pipe 122. However, in many other applications, a downhole motor 155 (mud motor) disposed in the BHA 190 also rotates the drill bit 150. The rate of penetration (ROP) for a given BHA largely depends on the WOB or the thrust force on the drill bit 150 and its rotational speed.

A surface control unit or controller 140 receives signals from the downhole sensors and devices via a sensor 143 placed in the fluid line 138 and signals from sensors S1-S6 and other sensors used in the system 101 and processes such signals according to programmed instructions provided to the surface control unit 140. The surface control unit 140 displays drilling parameters and other parameters of interest related to the borehole, formation, and drilling operations, and other information on a display/monitor 141 that is utilized by an operator to control the drilling operations. The surface control unit 140 may be a computer-based unit that may include a processor 142 (such as a microprocessor), a storage device 144, such as a solid-state memory, tape or hard disc, and one or more computer programs 146 in the storage device 144 that are accessible to the processor 142 for executing instructions contained in such programs. The surface control unit 140 may further communicate with a remote control unit 148. The surface control unit 140 may process data relating to the drilling operations, data from the sensors and devices on the surface, and data received from downhole; and may control one or more operations of the downhole and surface devices. The data may be transmitted in analog or digital form.

The BHA 190 may include a tool 110 configured for performing well logging measurements. The BHA 190 may also contain other formation evaluation sensors or devices (also referred to as measurement-while-drilling ("MWD") or logging-while-drilling ("LWD") sensors) determining resistivity, density, porosity, permeability, acoustic properties, nuclear-magnetic resonance properties, formation pressures, properties or characteristics of the fluids downhole and other desired properties of the formation 195 surrounding the BHA 150. For convenience, all such sensors are generally denoted herein by numeral 165. The BHA 190 may further include a variety of other sensors and devices 159 for determining one or more properties of the BHA 190, such as vibration, bending moment, acceleration, oscillations, whirl, stick-slip, weight-on-bit, fluid flow rate, pressure, temperature, rate of penetration, azimuth, tool face, drill bit rotation, etc.

The BHA 190 may include a steering apparatus or tool 158 for steering the drill bit 50 along a desired drilling path. In one aspect, the steering apparatus may include a steering unit 160, having a number of force application members 161a-161n. The force application members may be mounted directly on the drill string, or they may be at least partially integrated into the drilling motor. In another aspect, the force application members may be mounted on a sleeve, which is rotatable about the center axis of the drill string. The force application members may be activated using electro-mechanical, electro-hydraulic or mud-hydraulic actuators. In yet another embodiment the steering apparatus may include a steering unit 158 having a bent sub and a first steering device 158a to orient the bent sub in the wellbore and the second steering device 158b to maintain the bent sub along a selected drilling direction. The steering unit 158, 160 may include near-bit inclinometers and magnetometers.

The drilling system 101 may include sensors, circuitry and processing software and algorithms for providing information about desired drilling parameters relating to the BHA, drill string, the drill bit and downhole equipment such as a drilling motor, steering unit, thrusters, etc. Many current drilling systems, especially for drilling highly deviated and horizontal wellbores, utilize coiled-tubing for conveying the drilling assembly downhole. In such applications a thruster may be deployed in the drill string 120 to provide the required force on the drill bit.

Exemplary sensors for determining drilling parameters include, but are not limited to drill bit sensors, an RPM sensor, a weight on bit sensor, sensors for measuring mud motor parameters (e.g., mud motor stator temperature, differential pressure across a mud motor, and fluid flow rate through a mud motor), and sensors for measuring acceleration, vibration, whirl, radial displacement, stick-slip, torque, shock, vibration, strain, stress, bending moment, bit bounce, axial thrust, friction, backward rotation, BHA buckling, and radial thrust. Sensors distributed along the drill string can measure physical quantities such as drill string acceleration and strain, internal pressures in the drill string bore, external pressure in the annulus, vibration, temperature, electrical and magnetic field intensities inside the drill string, bore of the drill string, etc. Suitable systems for making dynamic downhole measurements include COPILOT, a downhole measurement system, manufactured by BAKER HUGHES INCORPORATED.

The drilling system 101 can include one or more downhole processors at a suitable location such as 193 on the BHA 190. The processor(s) can be a microprocessor that uses a computer program implemented on a suitable non-transitory computer-readable medium that enables the processor to perform the control of system 101 and processing of information, such as information from the sensors. The non-transitory computer-readable medium may include one or more ROMs, EPROMs, EAROMs, EEPROMs, flash memories, RAMs, hard drives and/or optical disks. Other equipment such as power and data buses, power supplies, and the like will be apparent to one skilled in the art. In one embodiment, the MWD system utilizes mud pulse telemetry to communicate data from a downhole location to the surface while drilling operations take place. The surface processor 142 can process the surface measured data, along with the data transmitted from the downhole processor, to evaluate the formation.

Surface processor 142 or downhole processor 193 may also be configured to control steering apparatus 158, mud pump 134, drawworks 130, rotary table 114, downhole motor 155, other components of the BHA 190, or other components of the drilling system 101. Surface processor 142 or downhole processor 193 may be configured to control sensors described above and to estimate a parameter of interest according to methods described herein.

Control of these components may be carried out using one or more models using methods described below. For example, surface processor 142 or downhole processor 193 may be configured to modify drilling operations i) autonomously upon triggering conditions, ii) in response to operator commands, or iii) combinations of these. Such modifications may include changing drilling parameters, steering the drillbit (e.g., geosteering), altering the drilling fluid program, activating well control measures, and so on. Control of these devices, and of the various processes of the drilling system generally, may be carried out in a completely automated fashion or through interaction with personnel via notifications, graphical representations, user interfaces and the like. Reference information accessible to the processor may also be used. In some general embodiments, surface processor 142, downhole processor 193, or other processors (e.g. remote processors) may be configured to operate the well logging tool 110 to make well logging measurements. Each of these logical components of the drilling system may be implemented as one or more electrical components, such as integrated circuits (ICs), operatively connected via a circuit board in accordance with techniques of the present disclosure.

The system 101 may include any number of downhole tools for various processes including formation drilling, geosteering, and formation evaluation (FE) for making measurements versus depth and/or time of one or more physical properties in or around a borehole, including a volume of interest of the formation intersected by the borehole. The tool 110 may be included in or embodied as a BHA, drillstring component or other suitable carrier.

While a drill string 120 is shown as a conveyance device for tool 110, it should be understood that embodiments of the present disclosure may be used in connection with tools conveyed via rigid (e.g. jointed tubular or coiled tubing) as well as non-rigid (e. g. wireline, slickline, e-line, etc.) conveyance systems. The drilling system 101 may include a bottomhole assembly and/or sensors and equipment for implementation of embodiments of the present disclosure on either a drill string or a wireline.

Mitigation of Electrical Connectivity Failure

General embodiments of the present disclosure may include a tool for performing well logging in a borehole intersecting an earth formation. The tool may include a printed circuit board used in operation of the tool.

Figure 2A:
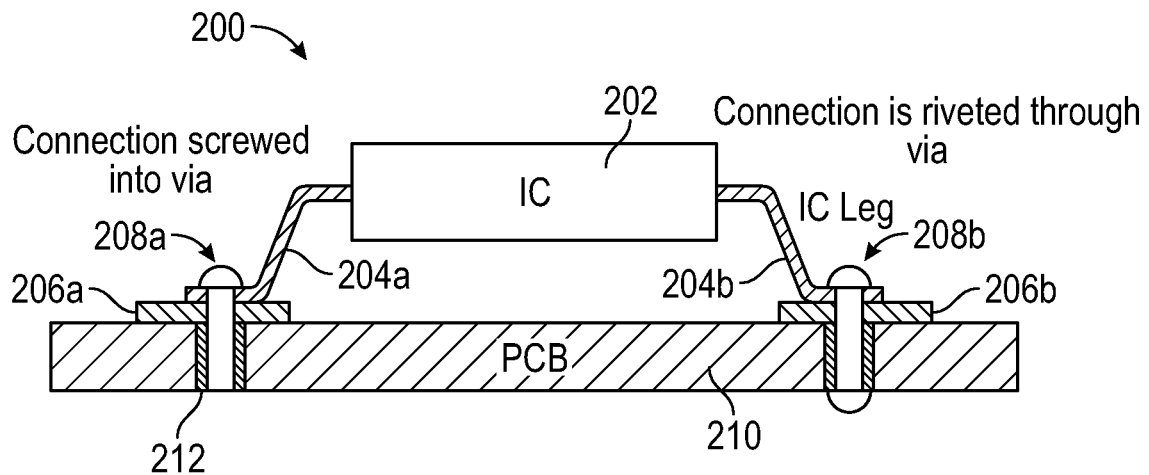
FIGS. 2A & 2B illustrate an assembly in accordance with embodiments of the present disclosure.
Figure 2B:
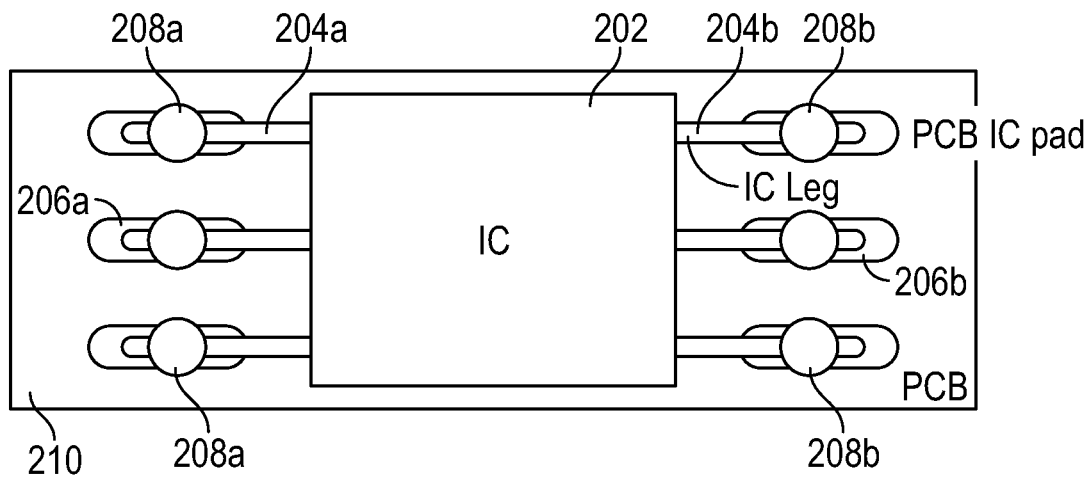

FIGS. 2A & 2B illustrate an assembly in accordance with embodiments of the present disclosure. Assembly 200 includes a printed circuit board 210 comprising electrically conductive contact surfaces (e.g., pads) 206a, 206b for connection of circuit elements via the board. Assembly 200 also includes a circuit element 202. Here the circuit element 202 is implemented as an IC having legs 204a and 204b for operative electrical connection.

A first mechanical fastener 208a (a screw) attaches the first leg 204a to the first contact surface 206a. A second mechanical fastener 208b (a rivet) attaches the second leg 204b to the second contact surface 206b. In other embodiments, fasteners may be reversed or may be implemented entirely of screws or entirely of rivets, or using other fasteners as will occur to those of skill in the art, including bolts, staples, swages, and so on. Via's can be very accurately placed on the PCB via an automated process that is both fast and highly accurate. With an adaptation, this via insertion system (or other 'pick and place' automated system) can be utilized to insert and attach the mechanical fasteners with a similar degree of automation and speed.

In the implementation of FIGS. 2A & 2B, for each leg a fastener penetrates through the leg and the corresponding contact surface, and resides in a conductive via 212 of the PCB proximate the pad. The fastener itself may be conductive. In other implementations, the fastener may lie outside the via, or the PCB may lack a via. The fastener may penetrate only the leg, only the contact surface, or neither, in accordance with associated advantages and disadvantages of the design in dependence upon the demands of a particular application. The fastener may be significantly electrically conductive. In some implementations, fasteners of the present disclosure may have a resistivity less than $10^{-3}$ ohm-meters. The fastener may be a load-bearing fastener. The fastener does not add to the footprint of the PCB. That is, a footprint of the PCB and the fastener in combination is substantially the same as the footprint of the PCB alone.

The fasteners 208a and 208b each apply a force maintaining a surface of each leg in sufficient physical contact with a corresponding one of the contact surfaces for uninterrupted electrical connection. Thus, the legs 204a, 204b of the element 202 are permanently electrically coupled to the printed circuit board via application of the force by the respective mechanical fasteners. The force may act directly on the corresponding contact surfaces. The force may be implemented as a clamping force for each leg, provided by the respective fastener, and acting directly on the surface of each leg and the corresponding one of the contact surfaces in opposing directions. The fastener may be putting the lead in compression by placing the fastener in tension. In a mechanical fastener such as a screw or swage there may be multiple forces involved acting in various directions. The fasteners may constrain each leg in three dimensions.

Figure 3:
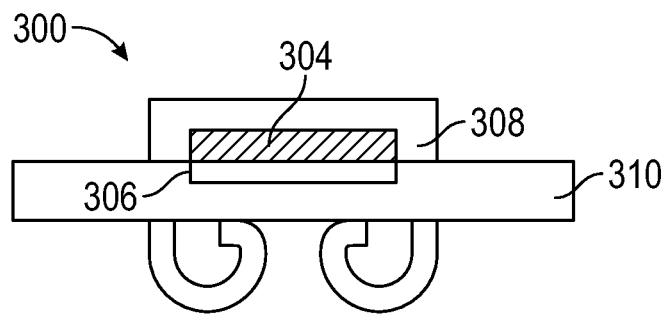
FIG. 3 illustrates another assembly in accordance with embodiments of the present disclosure.

FIG. 3 illustrates another assembly in accordance with embodiments of the present disclosure. Assembly 300 includes a printed circuit board 310 comprising electrically conductive contact surfaces 306 for connection of circuit elements via the board. Assembly 300 also includes a circuit element 202. A staple 308 attaches a leg 304 to the contact surface 206. The PCB 310 is penetrated by staple 308, but the leg 304 is not.

Figure 4A:
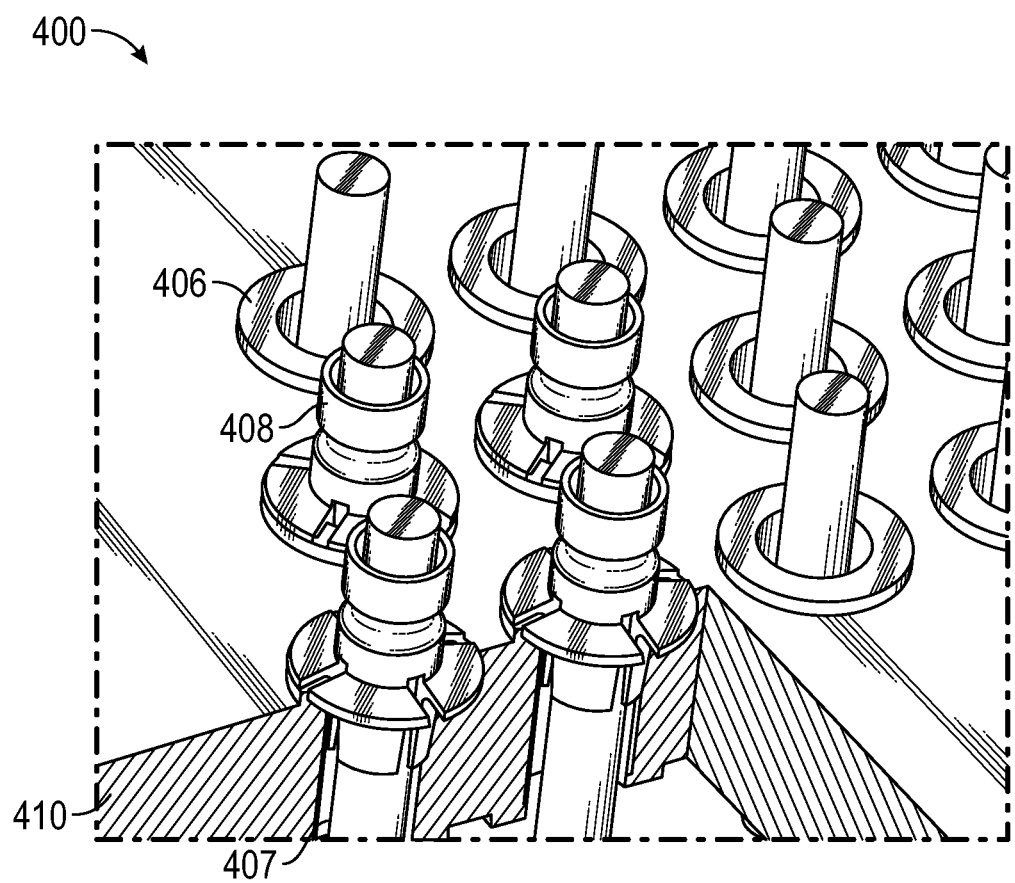
FIGS. 4A-4C illustrate a swage connected assembly in accordance with embodiments of the present disclosure.
Figure 4B:
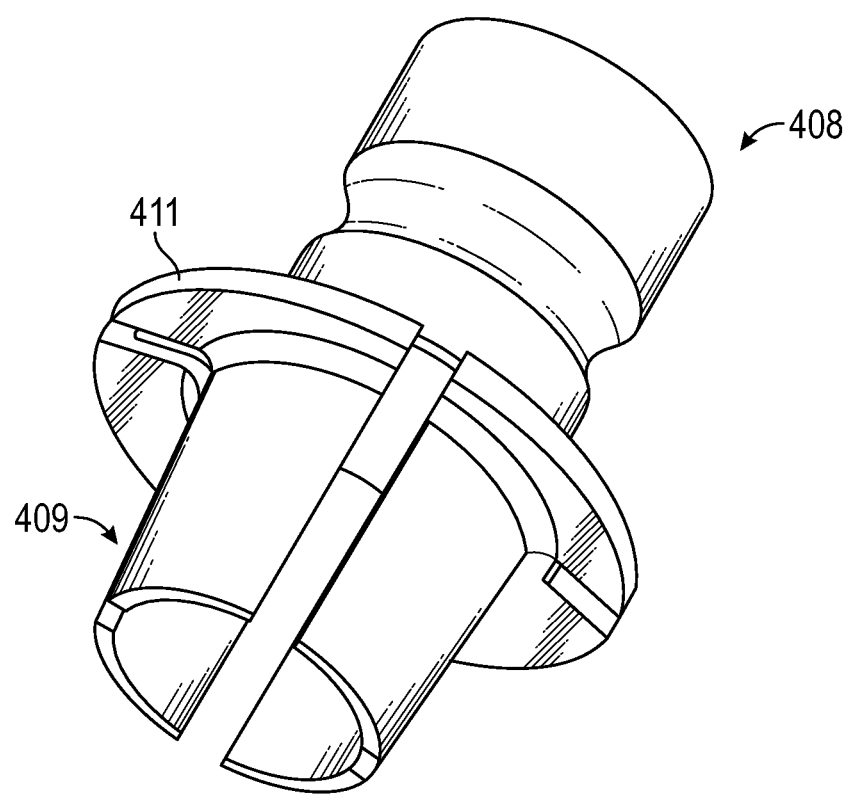
Figure 4C:
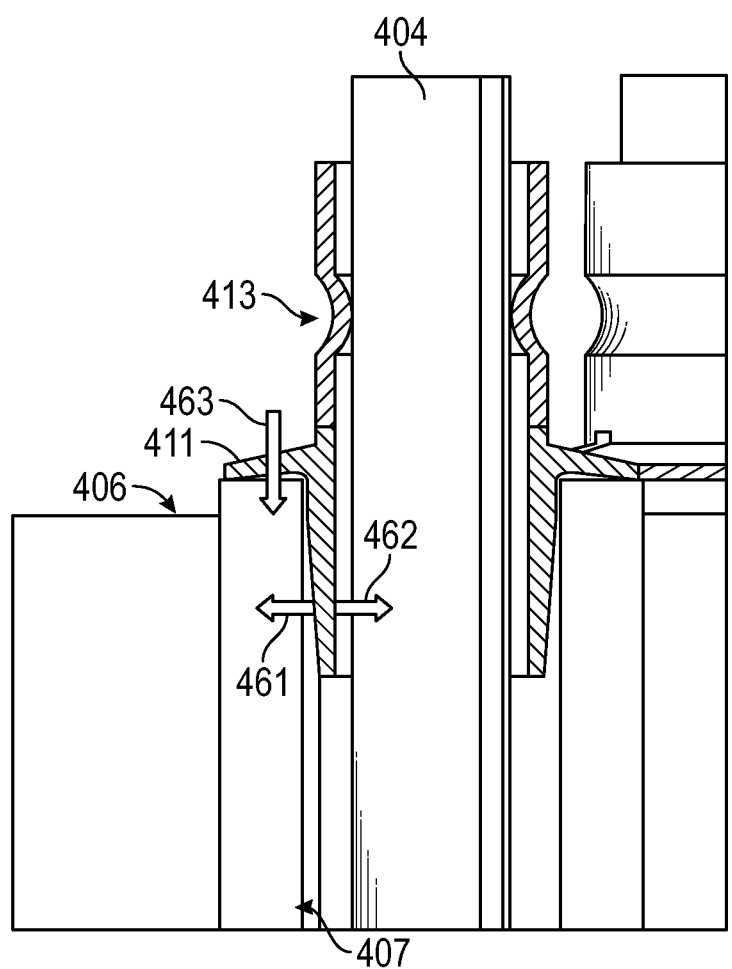

FIGS. 4A-4C illustrate a swage connected assembly in accordance with embodiments of the present disclosure. The assembly 400 features through-hole swage fasteners 408. The electrically conductive contact surfaces 406 comprise vias 407 opening to a plurality of surfaces of the PCB 410. The legs 404, together with the fastener 408, are held in place by the swaging interaction, which provides a mechanical and electrical bond for the leg with the via.

Referring to FIG. 4B, fastener 408 is tapered and includes a collet type nose arrangement 409 that will compress against the component leg as it is pushed against the via. The fastener also includes an integrated Belleville washer (spring) collar 411 that will help keep a preload and maintain a good electrical contact. It should be noted that the washer is split to maintain the contact with the via even under vibration.

FIG. 4C shows a schematic cross-sectional view of the assembly upon installation. For installation, a pre-load may be applied to the leg 404 while the collar 411 is urged firmly against the via 407 while a crimp is applied. The crimp 413 may engage the circumference of the leg at the top to maintain the preload. The fastener may act to mechanically deform the leg.

The fastener 408 applies at least a portion of the force maintaining contact, with at least a first portion of the force 461 against an inner surface of a conductive via of the PCB. Fastener 408 applies a second portion of the force 462 against an outer surface of the leg opposite the first portion, and a third portion of the force 463 against a contact surface proximate the inner surface of the conductive via, the third portion being substantially perpendicular to the first portion and the second portion. The uninterrupted electrical connection may be a solderless connection.

Figure 5A:
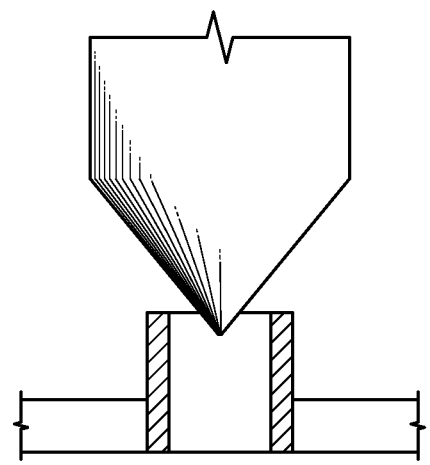
FIGS. 5A-5E illustrate techniques for deforming a via of the PCB using a swaging device in accordance with embodiments of the present disclosure.
Figure 5B:
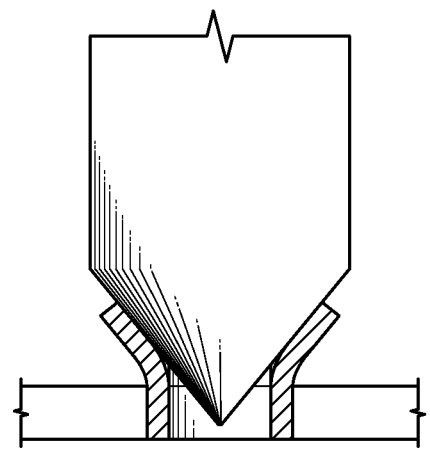
Figure 5C:
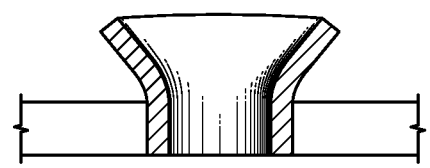
Figure 5D:
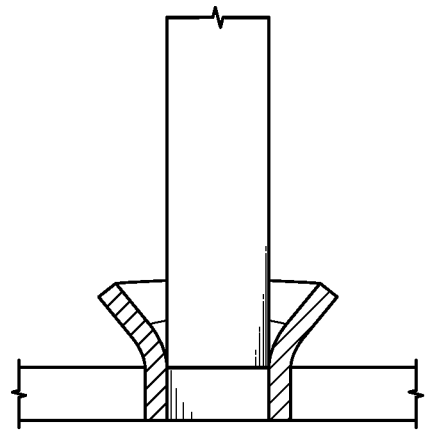
Figure 5E:
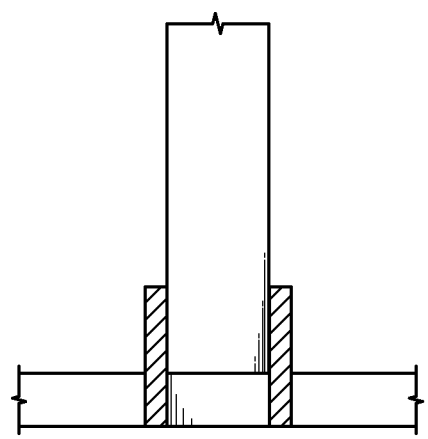

FIGS. 5A-5E illustrate techniques for deforming a via of the PCB using a swaging device in accordance with embodiments of the present disclosure. Referring to FIG. 5A, the swaging device 501 deforms the via 512, which may include a conducting sleeve 507 mounted in the PCB 510. The conducting sleeve 507 may be made of shape memory alloy (SMA). Referring to FIG. 5B, the swaging device 501 is lowered into the sleeve 507, which is deformed. Referring to FIG. 5C, the device 501 is removed, and the opened SMA sleeve 507 is at a low temperature state. In FIG. 5D, the leg 504 is lowered into the opened sleeve 507. In FIG. 5E, the sleeve 507 is exposed to heat which causes the sleeve to return to its original shape, resulting in the sleeve 507 clasping the leg 504. In non-SMA embodiments, the leg may be forced into position for an interference fit.

Increasing Absorption of Laser Light

As described above, aspects of the disclosure relate to improved techniques for attachment of legs of the element using laser heating, such as, for example, laser soldering, laser sintering, laser welding, and combined laser welding-soldering, by increasing absorption of the laser light by the material to be heated.

Figure 6A:
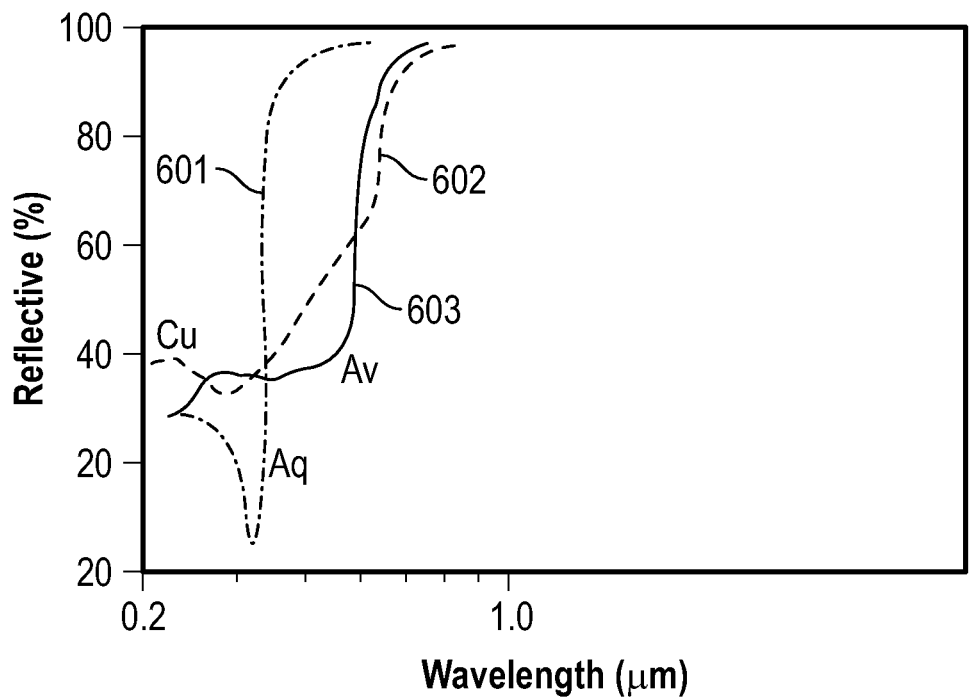
FIG. 6A illustrates reflection spectra of various metals.

FIG. 6A illustrates reflection spectra of various metals. Curve 601 represents wavelength dependent reflectance for silver. Curve 602 represents wavelength dependent reflectance for copper. Curve 603 represents wavelength dependent reflectance for gold. As can be seen, the minimum reflecting wavelengths for silver (Ag) and gold (Au) are each between 300 and 400 nanometers. Silver and gold are often used as high-temperature, high-conductivity solder materials.

One improvement is to use a wavelength of laser light that is shorter than the mostly-reflected wavelengths for that material, and thus are much better absorbed by the metal than are the traditional laser soldering wavelengths (e.g., 820 nanometers, 900 nanometers, 1.06 microns, or 10.6 microns). For example, techniques may include using a wavelength of light less than 450 nanometers for gold, less than 330 nanometers for silver, and so on. The 405 nm blue-violet laser in a Blu-ray disc player can be focused to a smaller spot with greater precision than the traditional longer wavelengths of laser light used in players, which is why data on a Blu-ray disc can be packed more tightly into less space (http://www.blu-ray.com/info/). Other metals and alloys could also be used with corresponding more-absorbing wavelengths.

Another improvement is to apply a treatment that is highly absorbent or which makes the material highly absorbent. General embodiments include using a solder composite that contains both a metal and light-absorbing compounds, such as, for example, carbon ring compounds (e.g., graphene), noble metal nanoparticles (e.g., gold nanoparticles), indium-graphene, indium-gallium-graphene, and copper-graphene composites, and so on. Varying weight fractions of graphene nanosheets may be incorporated into high-temperature solder (e.g., Ag—Cu solder) using powder metallurgy. See Sruti, A. Naga; Jagannadham, K. Electrical Conductivity of Graphene Composites with In and In—Ga Alloy. Journal of Electronic Materials, Volume 39, Issue 8, pp. 1268-1276. August 2010.

Figure 6B:
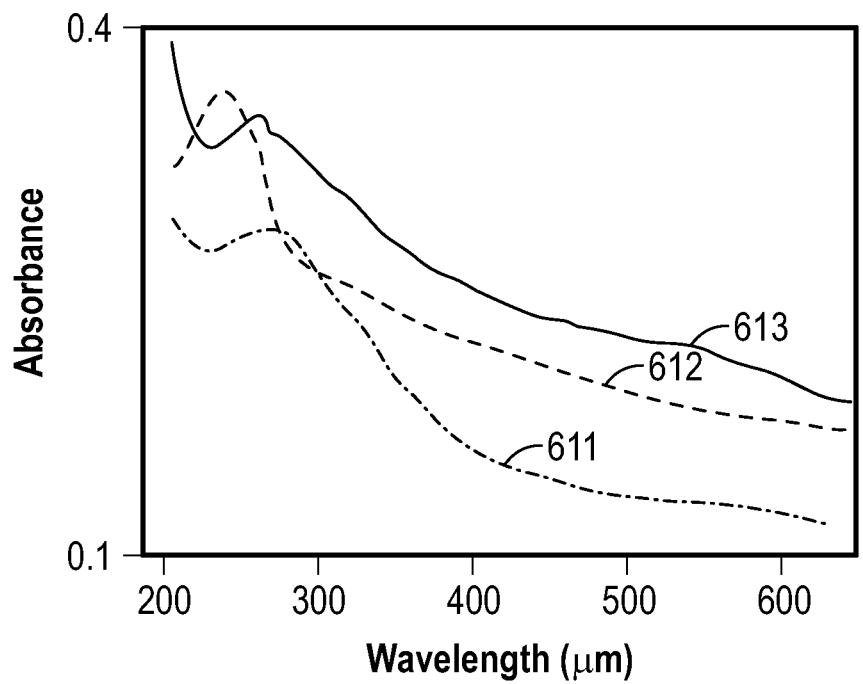
FIG. 6B shows a graph illustrating the high absorbance of graphene at short wavelengths in water.

FIG. 6B shows a graph illustrating the high absorbance of graphene at short wavelengths in water. Curve 611 represents wavelength dependent absorbance for graphene oxides. Curve 612 represents wavelength dependent absorbance for PAA-protected graphene. Curve 613 represents wavelength dependent absorbance for graphene/PAA-Au. In addition to being highly absorbent of all laser light, including those shorter wavelengths described above, graphene is also highly thermally and electrically conductive, so that heat absorbed at the surface of a solder ball is quickly dispersed throughout the solder ball.

Figure 6C:
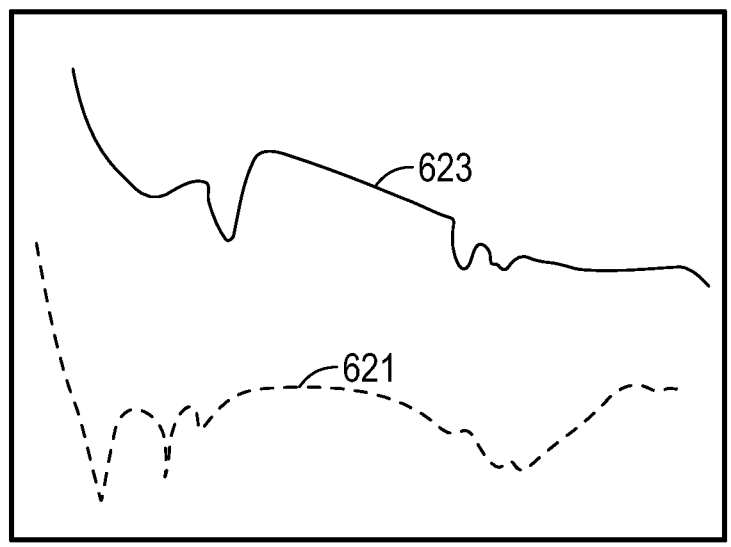
FIG. 6C shows a graph illustrating Fourier transform infrared spectroscopy ('FTIR') spectra of graphene.

FIG. 6C shows a graph illustrating Fourier transform infrared spectroscopy ('FTIR') spectra of graphene. Curve 621 represents wavelength dependent absorbance for graphene oxides. Curve 623 represents wavelength dependent absorbance for graphene/PAA-Au.

Alternatively, light absorbing particles may be included in the flux used with laser soldering and laser welding. Significantly thermally conductive flux may be used to both absorb heat and to distribute it around the solder ball. The light absorbing compounds may be applied to a conductive material via sintering. See Niziev, V. G. et al. Numerical modeling of sintering of two-component metal powders with laser beams. LAT 2010: International Conference on Lasers, Applications, and Technologies. Proceedings of the SPIE, Volume 7994 (2010). Niziev describes modeling sintering of a mixture of two metal powders with significantly different melting points.

The processes above may be automated in accordance with conventional techniques. The solder may be initially deposited by standard methods (such as a paste) with stencil or a bobbin. The laser may also control the temperature profile of the solder (the heating and cooling rate versus time), using temperature monitoring and feedback heating control, as described in Becket, P. M. et al. Numerical modeling of scanned beam laser soldering of fine pitch packages. Soldering & Surface Mount Technology, pp. 24-29 (2002). Commercial control systems may be used, such as, for example, the Beamworks Spark 400 Selective Laser Solder from First Place Machinery of Boston, Mass.

In other embodiments, multiple lasers having different wavelengths could be employed. A first laser may be configured to heat the solder, while a second laser may be configured to heat flux so as to better maintain thermal control of the soldering (or welding) process. See Hieber, H. Microsoldering with short-pulsed IR laser. Microelectronics and Packaging Conference (EMPC), 2011 18th European 2011 Sep. 12 (pp. 1-5). IEEE. The laser could also be operated in an inert environments (such as, for example, pure nitrogen, argon, or helium) to avoid oxidation and other problems. The substrate may be preheated, either by laser light, heat lamps, or other means, immediately before laser soldering. The lasers may have different locations and orientations for omnidirectional heating, be applied with different intensities or timing, or used in conjunction with hybrid and microassembly attachments and multi-chip modules. Various techniques for improved laser attachment are discussed in Ruttimann, C. and Holtz, R. Reliable laser welding of highly reflective materials. Proc. SPIE 8065, SPIE Eco-Photonics 2011: Sustainable Design, Manufacturing, and Engineering Workforce Education for a Green Future, 80650X (Apr. 20, 2011).

Figure 7A:
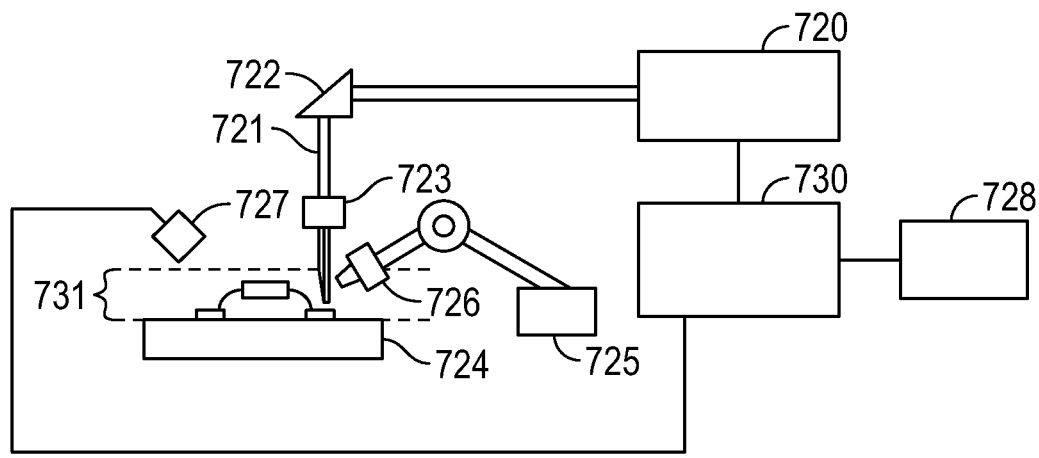
FIG. 7A illustrates a schematic diagram of a laser attachment system according to an embodiment of this invention.

FIG. 7A illustrates a schematic diagram of a laser attachment system according to an embodiment of this invention. Laser 720 generates a light beam used in the attachment system. The beam is directed through beam guide 721, deflected by mirror 722, and through focus lens 723. The laser then impinges the material of the PCB 724 to be heated. Flux, such as, for example, inert gas shield 731, is fed through onto the PCB 24. Material dispenser 725 operates to provide one or more of solder, flux, treatment, or sintering material, and may include a guidable feed nozzle head 726. Beam guide 721 may include fiber optic materials such as fiber optic laser transmission lines. Multiple beams may be implemented using multiple lasers or by splitting the beam.

Controller 730 may be a computer numerically controlled (CNC) laser operation system. CNC controller 730 coordinates components of the system. As is known in the art the controller may also include a digital imaging system. Optical sensor(s) 727 may provide to the controller 730 workpiece coordinates and feedback with respect to the effects and operational parameters of the focused beam 721 and material dispenser 725. Components of the system, such as laser 720, may include integrated sensors which provide information as well. Information may be presented on display 728. The controller guides movement of the laser and the material dispenser across the face of the PCB 724. Movement is achieved by control of the laser arm; i.e., through translation or rotation, up to and including six degrees of freedom. Alternatively, movement of the PCB may be achieved through movement of a support on which PCB 724 rests.

Figure 7B:
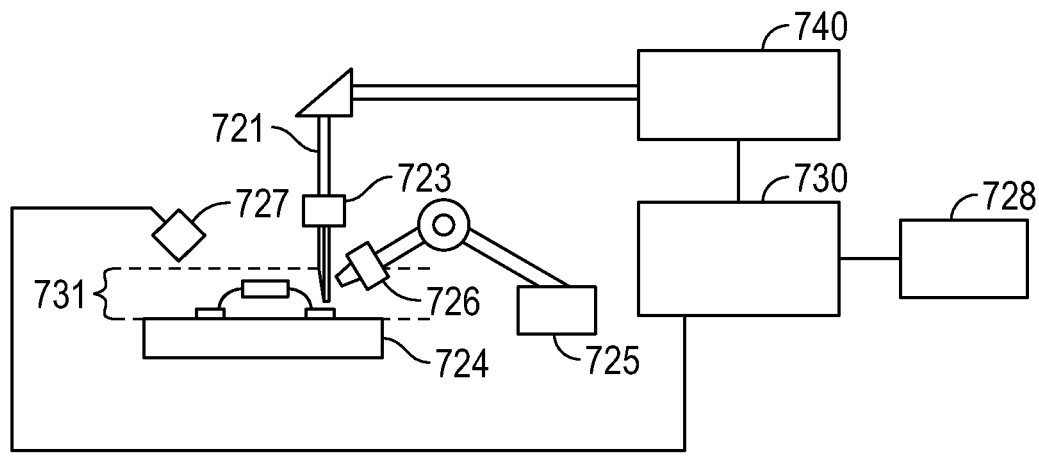
FIG. 7B illustrates a perspective view of an example electrical assembly manufactured with an attachment system in accordance with embodiments of the present disclosure.

FIG. 7B illustrates another schematic diagram of a laser attachment system according to an embodiment of this invention for applying light from a second laser to a flux material of the circuit board. Laser 740 generates a light beam used in the attachment system. The beam is directed through beam guide 721, deflected by mirror 722, and through focus lens 723. The laser then impinges the material of the PCB 724 to be heated, such as flux provided by guidable feed nozzle head 726 of material dispenser 725 and fed through onto the PCB 24.

Figure 7C:
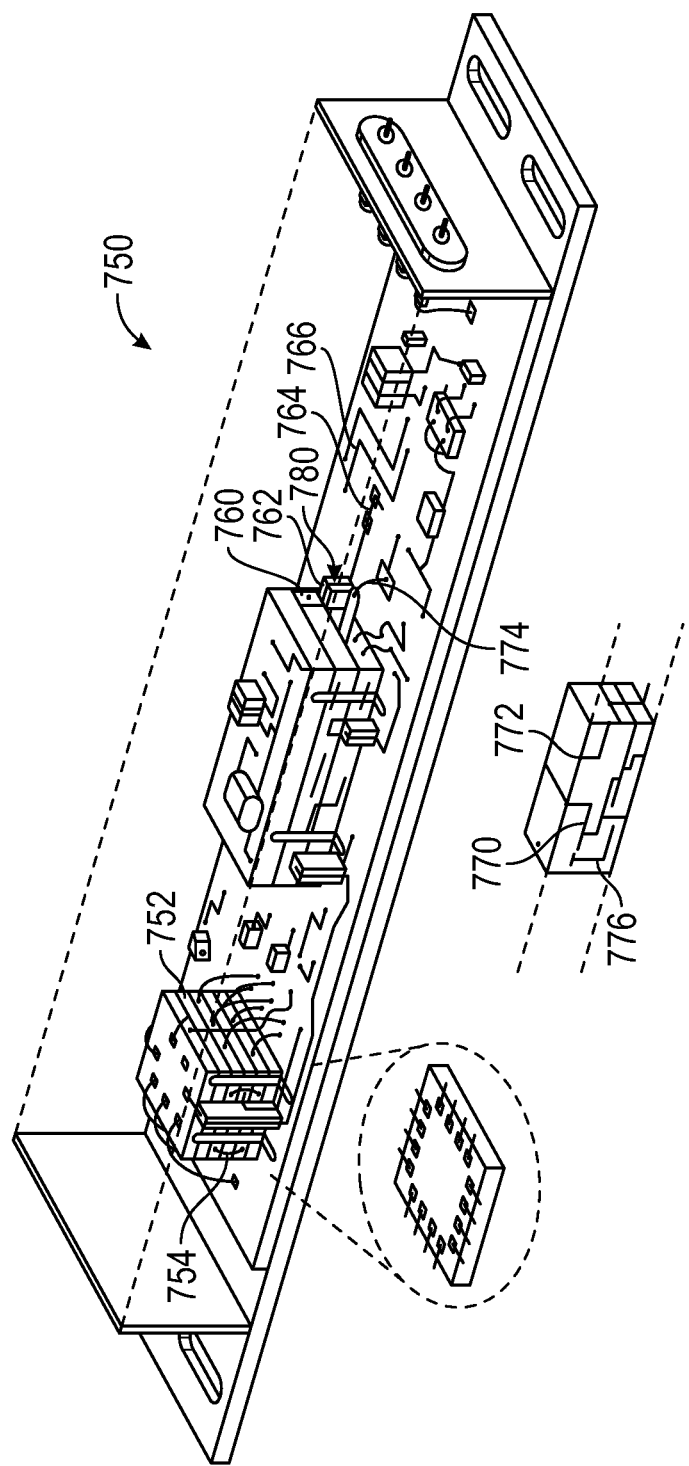
FIG. 7C illustrates a perspective view of an example electrical assembly manufactured with an attachment system in accordance with embodiments of the present disclosure.

FIG. 7C illustrates a perspective view of an example electrical assembly manufactured with an attachment system in accordance with embodiments of the present disclosure. Laser 720 as described above may be modified or added to a pick-and-place assembly system for the attachment system. The assembly system uses laser for welding, soldering and construction of assembly elements with additive manufacturing materials in the same equipment chamber, including with different nozzles and laser wavelengths as necessary. Alternatively, multiple different optical source wavelengths and different nano powders could be employed with a single nozzle and laser waveguide. The assembly process may be done concurrently (e.g., in the same chamber) with placement of parts (e.g., ICs) by an automated pick and place handler.

A pick and place header could select from a dispenser and bond in place in an electrical assembly a component previously manufactured during a previous manufacturing step, either by an additive manufacturing or another assembly or manufacturing technique. The pick and place dispenser could supply passive electrical components (e.g. capacitors, inductors, transformers, etc.), Field Effect Transistors (FET's), Bipolar transistors (BJT), Digital, analog or mixed ICs, SoCs, memory modules (e.g., MCM assembly with memory IC components), quartz oscillators, and pressure, temperature, piezoelectric, coil, magnetic, and accelerometer sensors.

Methods of manufacturing a downhole electrical assembly as described herein may include forming a connection between a first component of the electrical assembly and a second component of the electrical assembly by causing heating of an additive manufacturing material by applying light from a laser. The connection may form a third component. Forming the connection may include mitigating reflection of the light from the material. The connection may be at least one of: i) an electrical connection; ii) a structural connection; iii) an electrical insulation.

Aspects of the present disclosure include the following types of resultant assemblies:
a) electrical component-electrical connection-electrical component
b) electrical component-electrical isolation-electrical component
c) assembly component-electrical isolation-assembly connection
d) assembly component-structural connection-assembly component
e) assembly component-structural connection-electrical component.

Electrical components may include terminals, connecting pads (e.g. PCB soldering pads), active components (IC diodes, operational amplifiers, digital signal processors, FPGAs, etc.), sensors, magnetic components or devices, passive devices, substrates (MCM-C, MCM-L, etc.), and so on as will occur to those of skill in the art. Any type of metal or non-metal structure of the electrical assembly may be generated using AM.

The electrical assembly 750 of FIG. 7B shows three dimensional structures. For example an IC stack may by electrically connected using IC-to-IC terminal connects 754 constructed as above. Such structures may include intermittent isolators 752 structurally connecting the ICs. Various other types of electrical connections may be accomplished, such as pad-to-pad interconnects 764, layer-to-layer connection vias 766 and 772, and aerial connections such as MCM terminal-to-substrate pad aerial connection 774. Interlayer connections 776 and layer-metal interconnects 770 are also carried out. MCM lateral connection terminals 760 and MCM terminal-to-substrate pad connection components 780 may also be constructed. Combined isolator/structural components 762 may be applied through AM as well.

Aspects of the present disclosure include using AM for 3D micro-fabrication of electronics and sensors which with this invention can be integrated into an electrical assembly including functional electrical and mechanical assembly components and electrical sub-assemblies manufactured with different technologies and separate manufacturing steps but integrated into a final electrical assembly. AM technology may be used as part of a sequence of steps for manufacturing electrical assemblies within the AM manufacturing chamber, including initially forming a base plate with materials with desired properties (e.g., metallic, electrically conductive, thermally conductive, electrically insulating, etc.). Other layers and components (e.g. AM concurrently built, previously built, or assembled) may be picked, placed and bonded (or fastened), with isolating layers, mechanical structure, connectors, hermetic seals, hermetic sealing package, mechanical mounting, attachment structures, and the like added thereafter in multiple manufacturing steps until the electrical assembly is finally completed with integrated capabilities. An intermediate step can include the manufacturing of a layer made with an electrically insulating material serving as support layer to build another assembly layer. Also, manufacturing can include a geometrically complex network of layers, vias, and channels built with high thermal conducting property material, which can serve as a network of heat dissipation paths never enabled or achieved before. A network of structural or electrical components may thus be included in the electrical assembly which is built concurrently with a corresponding thermal dissipation network designed and manufactured to achieve a given thermal dissipation performance.

Figure 8:
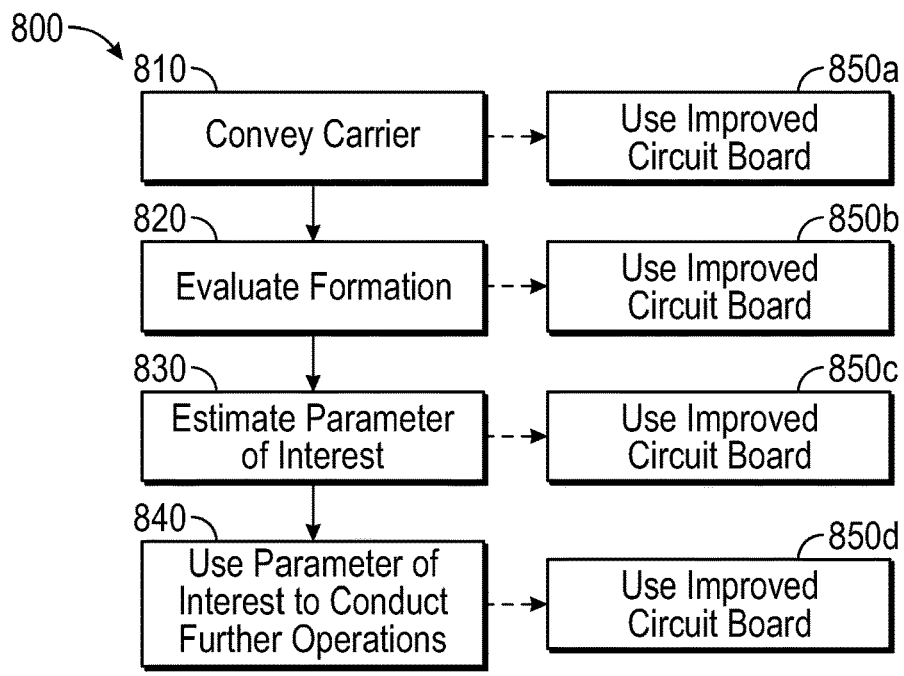
FIG. 8 shows a flow chart illustrating methods for exploring a formation of interest in accordance with embodiments of the present disclosure.

FIG. 8 shows a flow chart 800 illustrating methods for exploring a formation of interest in accordance with embodiments of the present disclosure. In optional step 810, a carrier is conveyed in a borehole in the earth formation. The borehole may be filled with downhole fluid, e.g., drilling mud. Conveyance may be carried out by extending the borehole via rotation of a drill bit at the distal end of the carrier to disintegrate the formation ahead of the bit. Formation evaluation (FE) instruments may be disposed on the carrier. Optional step 820 includes using an instrument to evaluate the formation, which may be carried out by taking measurements in the formation through utilization of physical phenomena (e.g., pulse echo acoustics) to generate measurement information. Optional step 830 comprises using the measurement information to estimate a parameter of interest. Optional step 840 comprises using the parameter of interest to conduct further operations in the formation. At least one of the steps above comprises conducting operations using an improved printed circuit board of the present disclosure within the borehole (optional steps 850a-850d).

Estimated parameters of interest may be stored (recorded) as information or visually depicted on a display. The parameters of interest (or other formation resistivity measurement information) may be transmitted before or after storage or display. For example, information may be transmitted to other downhole components or to the surface for storage, display, or further processing. Aspects of the present disclosure relate to modeling a volume of an earth formation using the estimated parameter of interest, such as, for example, by associating estimated parameter values with portions of the volume of interest to which they correspond. The model of the earth formation generated and maintained in aspects of the disclosure may be implemented as a representation of the earth formation stored as information. The information (e.g., data) may also be transmitted, stored on a non-transitory machine-readable medium, and/or rendered (e.g., visually depicted) on a display.

The processing of the measurements by a processor may occur at the tool, the surface, or at a remote location. The data acquisition may be controlled at least in part by the electronics. Implicit in the control and processing of the data is the use of a computer program on a suitable non-transitory machine readable medium that enables the processors to perform the control and processing. The non-transitory machine readable medium may include ROMs, EPROMs, EEPROMs, flash memories and optical disks. The term processor is intended to include devices such as a field programmable gate array (FPGA).

The term "conveyance device" as used above means any device, device component, combination of devices, media and/or member that may be used to convey, house, support or otherwise facilitate the use of another device, device component, combination of devices, media and/or member. Exemplary non-limiting conveyance devices include drill strings of the coiled tube type, of the jointed pipe type and any combination or portion thereof. Other conveyance device examples include casing pipes, wirelines, wire line sondes, slickline sondes, drop shots, downhole subs, BHA's, drill string inserts, modules, internal housings and substrate portions thereof, self-propelled tractors. As used above, the term "sub" refers to any structure that is configured to partially enclose, completely enclose, house, or support a device. The term "information" as used above includes any form of information (Analog, digital, EM, printed, etc.). The term "processor" or "information processing device" herein includes, but is not limited to, any device that transmits, receives, manipulates, converts, calculates, modulates, transposes, carries, stores or otherwise utilizes information. An information processing device may include a microprocessor, resident memory, and peripherals for executing programmed instructions. The processor may execute instructions stored in computer memory accessible to the processor, or may employ logic implemented as field-programmable gate arrays ('FPGAs'), application-specific integrated circuits ('ASICs'), other combinatorial or sequential logic hardware, and so on. Thus, configuration of the processor may include operative connection with resident memory and peripherals for executing programmed instructions.

Method embodiments may include conducting further operations in the earth formation in dependence upon the formation resistivity information, the logs, estimated parameters, or upon models created using ones of these. Further operations may include at least one of: i) extending the borehole; ii) drilling additional boreholes in the formation; iii) performing additional measurements on the formation; iv) estimating additional parameters of the formation; v) installing equipment in the borehole; vi) evaluating the formation; vii) optimizing present or future development in the formation or in a similar formation; viii) optimizing present or future exploration in the formation or in a similar formation; ix) evaluating the formation; and x) producing one or more hydrocarbons from the formation.

As used herein, the term "fluid" and "fluids" refers to one or more gasses, one or more liquids, and mixtures thereof. A "downhole fluid" as used herein includes any gas, liquid, flowable solid and other materials having a fluid property and relating to hydrocarbon recovery. A downhole fluid may be natural or man-made and may be transported downhole or may be recovered from a downhole location. Non-limiting examples of downhole fluids include drilling fluids, return fluids, formation fluids, production fluids containing one or more hydrocarbons, engineered fluids, oils and solvents used in conjunction with downhole tools, water, brine, and combinations thereof. An "engineered fluid" may be used herein to mean a human made fluid formulated for a particular purpose.

Aspects of the present disclosure relate to modeling a volume of an earth formation. The model of the earth formation generated and maintained in aspects of the disclosure may be implemented as a representation of the earth formation stored as information. The information (e.g., data) may be stored on a non-transitory machine-readable medium, transmitted, and rendered (e.g., visually depicted) on a display.

Figure 9:
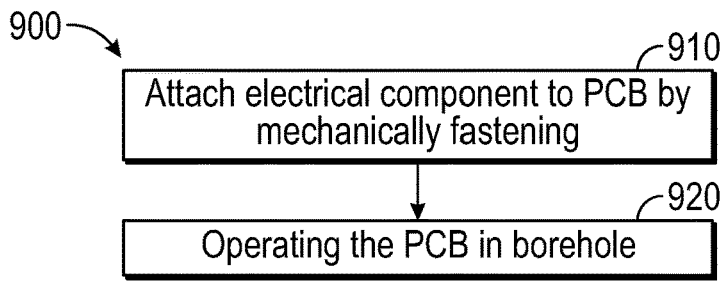
FIG. 9 shows a flow chart illustrating methods for manufacturing a circuit board in accordance with embodiments of the present disclosure.

FIG. 9 shows a flow chart 900 illustrating methods for manufacturing a circuit board in accordance with embodiments of the present disclosure. Optional step 910 comprises attaching an electrical component to a printed circuit board by mechanically fastening the electrical component to the printed circuit board. The printed circuit board may include electrically conductive contact surfaces for connection of circuit elements via the board and the electrical component may include at least one circuit element including a plurality of legs. Optional step 910 comprises permanently electrically coupling the electrical component to the printed circuit board. Step 910 may be carried out by welding the plurality of legs to respective ones of the contact surfaces using a laser. Step 920 comprises operating the printed circuit board in a borehole in the earth formation.

Figure 10:
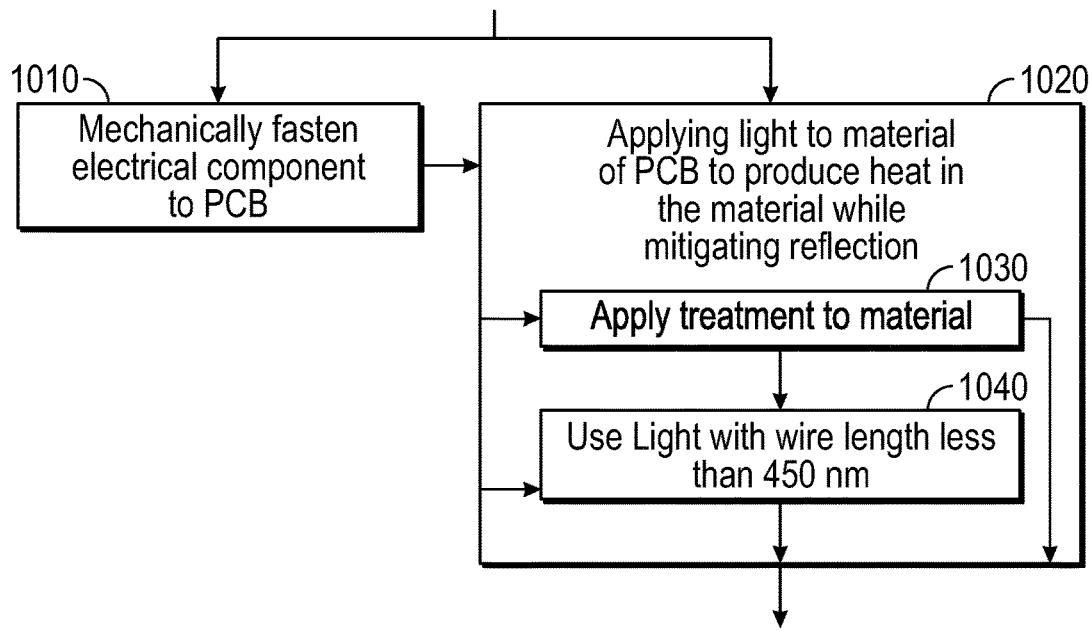
FIG. 10 shows a flow chart illustrating methods for attaching an electrical component to a printed circuit board.

FIG. 10 shows a flow chart 1000 illustrating methods for attaching an electrical component to a printed circuit board. Optional step 1010 comprises mechanically fastening the electrical component to the printed circuit board. Optional step 1020, which may be performed instead of or in addition to optional step 1010, comprises applying light from a laser to a material of the printed circuit board to produce heat, which may include mitigating reflection of the light from the material. Mitigating reflection may be carried out by applying a treatment to the material, wherein the treatment is configured to increase absorption of the light at the material (block 1030). The treatment may be significantly thermally conductive. Attaching an electrical component may include applying the light to solder, wherein the solder comprises a metal and a light absorbent compound. The light absorbent compound may comprise graphene.

Alternatively, mitigating reflection may be carried out by using a laser wherein the light has a wavelength of less than 450 nanometers (block 1040), which may be performed instead of or in addition to optional step 1030. The wavelength may be between 300 and 350 nanometers. Mitigating reflection may also include using light produced at a first wavelength to the material and applying light from a second laser to a second material of the circuit board, wherein the light from the second laser has a second wavelength different than the first wavelength. Methods may include controlling the first laser separately from the second laser.

A circuit element is an element that has a non-negligible effect on a circuit in addition to completion of the circuit. By leg, it is meant an extending terminal integrated with the component which goes on to connect to other parts of a circuit. As used herein, swage refers to any tubular fastener configured for interference fit with another connection element.

"Coupled by application of a force by at least one mechanical fastener," as used herein, refers to continuous application of force by a fastener, in contrast to incidental internal forces present in soldering and welding, application of a force during manufacture (e.g., to mold or punch components), and so on. In contrast, a solder joint does not rely on any internally stored force, achieving a connection between objects by bonding to each of the objects and/or surrounding the objects and solidifying.

"Significantly electrically conductive," as defined herein refers to materials having a resistivity less than $10^{-5}$ ohm-meters. "Uninterrupted electrical connection," as used herein, refers to a connection with identical or better connectivity than a good solder connection. "Permanently electrically coupled," as used herein, refers to a connection that is non-temporary and is not intended to be broken. The phrase "a material of the electrical assembly," as used herein, refers to a material of the assembly as completed by attaching electrical components, and thus, may include attachment of at least one of the pad or substrate of the PCB, the leg, other portions of the component; other portions of the PCB; and the solder. The material may also be an intermediate component thermally connected to at least one of the component, the substrate, and the solder.

While the foregoing disclosure is directed to the one mode embodiments of the disclosure, various modifications will be apparent to those skilled in the art. It is intended that all variations be embraced by the foregoing disclosure.

What is claimed is:

1. A method for manufacturing a downhole circuit board for use in well logging in a hot environment, the method comprising:

forming an electrical assembly including attaching an electrical component to a printed circuit board by applying light from a laser to a light absorbent graphene-composite solder to produce heat sufficient to melt the graphene-composite solder.

2. The method of claim 1 wherein the solder comprises a metal.

3. The method of claim 1 wherein the light has a wavelength of less than 450 nanometers.

4. The method of claim 1 wherein the light is produced at a first wavelength, the method further comprising applying light from a second laser to a flux material of the circuit board, wherein the light from the second laser has a second wavelength different than the first wavelength, and controlling the laser separately from the second laser.

5. The method of claim 1 wherein the electrical assembly is configured for use in a downhole well logging tool.

* * * * *